(12) United States Patent
Biloiu et al.

(10) Patent No.: US 11,270,864 B2
(45) Date of Patent: Mar. 8, 2022

(54) APPARATUS AND SYSTEM INCLUDING EXTRACTION OPTICS HAVING MOVABLE BLOCKERS

(71) Applicant: Applied Materials, Inc., Santa Clara, CA (US)

(72) Inventors: Costel Biloiu, Rockport, MA (US); Adam Calkins, Newmarket, NH (US); Alexander C. Kontos, Beverly, MA (US); James J. Howarth, Salem, MA (US)

(73) Assignee: Applied Materials, Inc., Santa Clara, CA (US)

( * ) Notice: Subject to any disclaimer, the term of this patent is extended or adjusted under 35 U.S.C. 154(b) by 212 days.

(21) Appl. No.: 16/828,886

(22) Filed: Mar. 24, 2020

(65) Prior Publication Data

US 2021/0305001 A1    Sep. 30, 2021

(51) Int. Cl.
*H01J 27/02*     (2006.01)
*H01J 37/317*    (2006.01)
*H01J 37/08*     (2006.01)

(52) U.S. Cl.
CPC ............ *H01J 27/024* (2013.01); *H01J 37/08* (2013.01); *H01J 37/3171* (2013.01); *H01J 2237/083* (2013.01)

(58) Field of Classification Search
CPC ...... H01J 27/024; H01J 37/08; H01J 37/3171; H01J 2237/083; H01J 37/1471
See application file for complete search history.

(56) References Cited

U.S. PATENT DOCUMENTS

| 8,497,486 B1 * | 7/2013 | Blahnik | H01J 27/024 250/423 R |
| 10,468,226 B1 | 11/2019 | Biloiu et al. | |

(Continued)

FOREIGN PATENT DOCUMENTS

| JP | 5216918 B2 | 6/2013 |
| WO | 2015035116 A1 | 3/2015 |

OTHER PUBLICATIONS

International Search Report dated Jun. 4, 2021, for the International Patent Application No. PCT/US2021/017618, filed on Feb. 11, 2021, 3 pages.

(Continued)

*Primary Examiner* — Brooke Purinton
(74) *Attorney, Agent, or Firm* — Kacvinsky Daisak Bluni PLLC

(57) ABSTRACT

Disclosed herein are approaches for adjusting extraction slits of an extraction plate using a set of adjustable beam blockers. In one approach, an ion extraction optics may include an extraction plate including a first opening and a second opening, and a first beam blocker extending over the first opening and a second beam blocker extending over the second opening. Each of the first and second beam blockers may include an inner slit defined by a first distance between an inner edge and the extraction plate, and an outer slit defined by a second distance between an outer edge and the extraction plate, wherein the first and second beam blockers are movable to vary at least one of the first distance and the second distance. As a result, extraction through the inner and outer slits of ion beamlets characterized by similar mean angles may be achieved.

19 Claims, 9 Drawing Sheets

(56) References Cited

U.S. PATENT DOCUMENTS

| | | | |
|---|---|---|---|
| 2013/0256566 A1* | 10/2013 | Kariya | H01L 21/67213 250/492.21 |
| 2014/0272179 A1* | 9/2014 | Radovanov | H01J 37/32357 427/523 |
| 2014/0353517 A1* | 12/2014 | Kabasawa | H01J 37/3172 250/396 R |
| 2016/0086759 A1* | 3/2016 | Horsky | C23C 14/48 315/111.21 |
| 2016/0189935 A1 | 6/2016 | Biloiu et al. | |
| 2018/0122650 A1* | 5/2018 | Ma | H01J 37/32422 |
| 2019/0237292 A1 | 8/2019 | Park | |
| 2019/0348287 A1* | 11/2019 | Varghese | H01L 21/68764 |

OTHER PUBLICATIONS

Written Opinion dated Jun. 4, 2021, for the International Patent Application No. PCT/US2021/017618, filed on Feb. 11, 2021, 4 pages.

\* cited by examiner

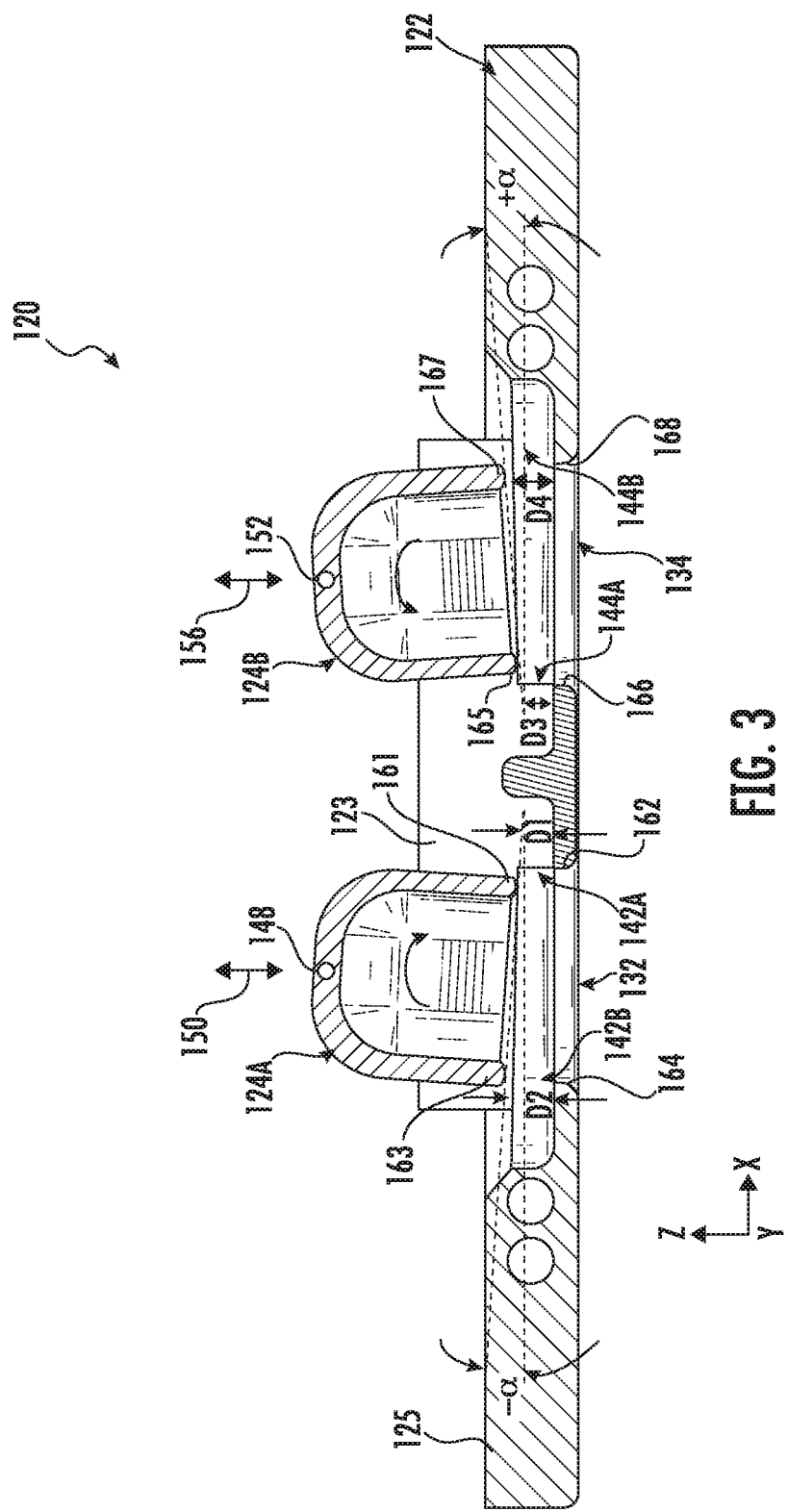

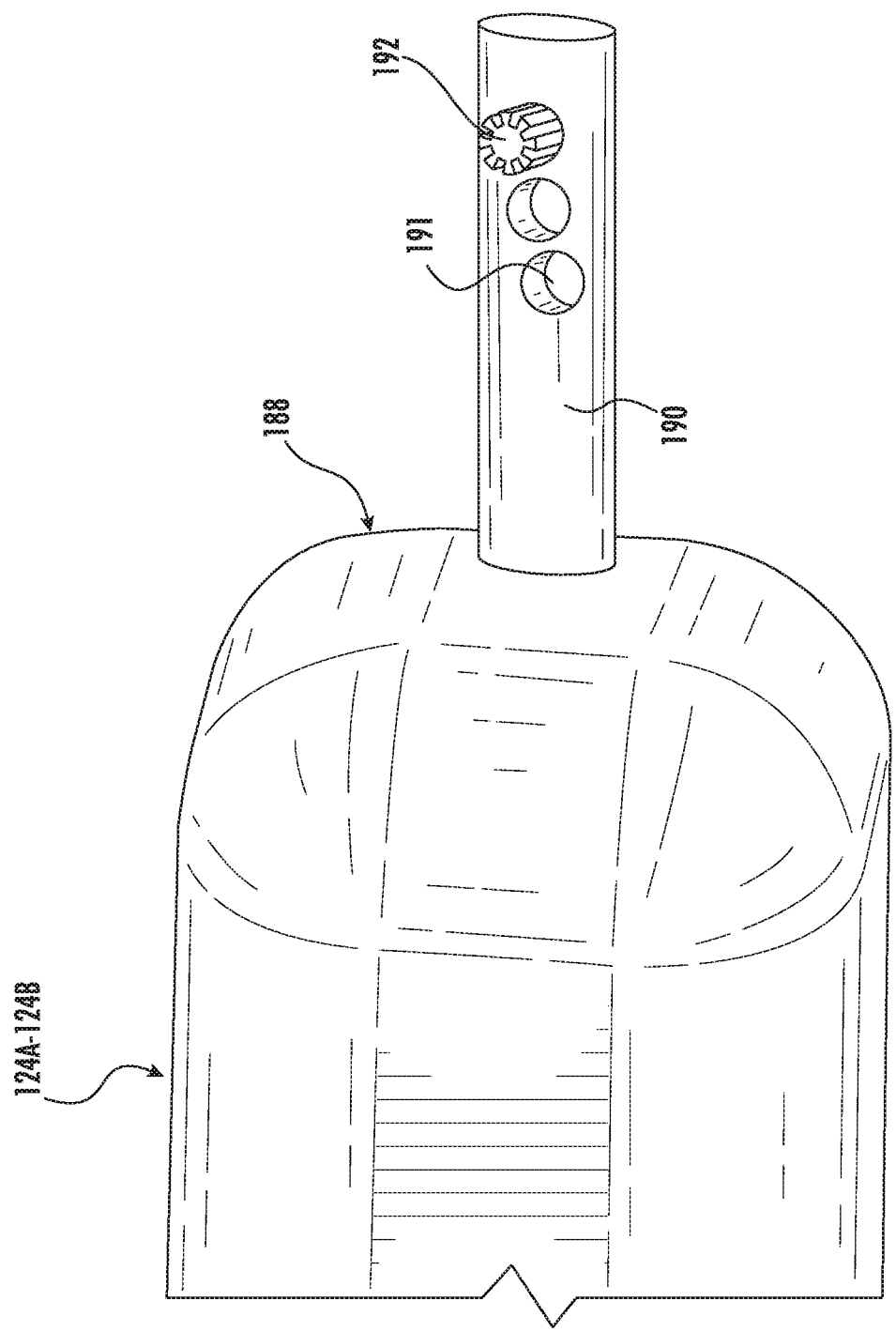

200

> PROVIDING AN EXTRACTION OPTICS ARRANGED ALONG A SIDE OF A PLASMA CHAMBER, THE ION EXTRACTION OPTICS INCLUDING AN EXTRACTION PLATE INCLUDING A FIRST OPENING AND A SECOND OPENING, AND A FIRST BLOCKER EXTENDING OVER THE FIRST OPENING AND A SECOND BLOCKER EXTENDING OVER THE SECOND OPENING, EACH OF THE FIRST AND SECOND BLOCKERS INCLUDING AN INNER SLIT DEFINED BY A FIRST DISTANCE BETWEEN AN INNER EDGE AND THE EXTRACTION PLATE, AND AN OUTER SLIT DEFINED BY A SECOND DISTANCE BETWEEN AN OUTER EDGE AND THE EXTRACTION PLATE
> 201

↓

> VARYING AT LEAST ONE OF THE FIRST DISTANCE AND THE SECOND DISTANCE BY MOVING THE FIRST AND SECOND BLOCKERS
> 203

↓

> DELIVERING AN ION BEAMLET TO A WAFER THROUGH EACH OF THE INNER AND OUTER SLITS
> 205

FIG. 7

APPARATUS AND SYSTEM INCLUDING EXTRACTION OPTICS HAVING MOVABLE BLOCKERS

FIELD OF THE DISCLOSURE

The present embodiments relate to a processing apparatus, and more particularly, to apparatus for improved ion extraction from a plasma.

BACKGROUND OF THE DISCLOSURE

Known apparatuses used to treat substrates with ions include beamline ion implanters and plasma immersion ion implantation tools. These approaches are useful for implanting ions over a range of energies. In beamline ion implanters, ions are extracted from a source, mass analyzed and then transported to the substrate surface. In plasma immersion ion implantation apparatus, a substrate is located in the same chamber the plasma is generated adjacent to the plasma. The substrate is set at negative potential with respect to the plasma, and ions crossing the plasma sheath in front of the substrate may impinge on the substrate at a perpendicular incidence angle.

Many of plasma assisted processing applications require zero or small on-wafer ion beam incidence angles. However, certain complex processes, such as controlled etching of trench sidewalls, hole elongation, photoresist shrinking, and magnetic random memory structures etching, in which ion beams having ion angular distributions (IADs) characterized by non-zero on-wafer mean angle of incidence, provide additional challenges. Some current approaches deliver ion beams with a tunable ion angular distribution to increase the processing throughput the ion beam current is increased by increasing the number of extraction slits. However, there are differences in angular distributions of the ion beamlets originating from different extraction slits. The discrepancy becomes more pronounced as the rf power and, implicitly, the plasma density, is decreased. It is with respect to these and other considerations, the present disclosure is provided.

SUMMARY OF THE DISCLOSURE

In one approach, an ion extraction system may include a plasma chamber operable to generate a plasma, and an ion extraction optics arranged along a side of the plasma chamber. The ion extraction optics may include an extraction plate including a first opening, and a first beam blocker extending over the first opening, wherein the first beam blocker includes a first inner slit defined by a first distance between a first beam blocker first edge and the extraction plate, and a first outer slit defined by a second distance between a first beam blocker second edge and the extraction plate, wherein the first beam blocker is movable to vary at least one of the first distance and the second distance.

In another approach, an ion extraction optics may include an extraction plate including a first opening and a second opening, and a first beam blocker extending over the first opening and a second beam blocker extending over the second opening. Each of the first and second beam blockers may include an inner slit defined by a first distance between an inner edge and the extraction plate, and an outer slit defined by a second distance between an outer edge and the extraction plate, wherein the first and second beam blockers are movable to vary at least one of the first distance and the second distance.

In yet another approach, a method may include providing an ion extraction optics arranged along a side of a plasma chamber, the ion extraction optics including an extraction plate including a first opening and a second opening, and a first beam blocker extending over the first opening and a second beam blocker extending over the second opening. Each of the first and second beam blockers may include an inner slit defined by a first distance between an inner edge and the extraction plate, and an outer slit defined by a second distance between an outer edge and the extraction plate. The method may further include varying at least one of the first distance and the second distance by moving the first and second beam blockers.

BRIEF DESCRIPTION OF THE DRAWINGS

The accompanying drawings illustrate exemplary approaches of the disclosed embodiments so far devised for the practical application of the principles thereof, and wherein:

FIG. 3 is a side cross sectional view of the extraction optics of FIG. 2B along cutline 4-4 according to various embodiments of the present disclosure;

FIGS. 6A-6B are perspective views of an apparatus for rotating the beam blockers according to various embodiments of the present disclosure; and FIG. 7 is a flowchart depicting a method in accordance with embodiments of the present disclosure.

Figure 1:
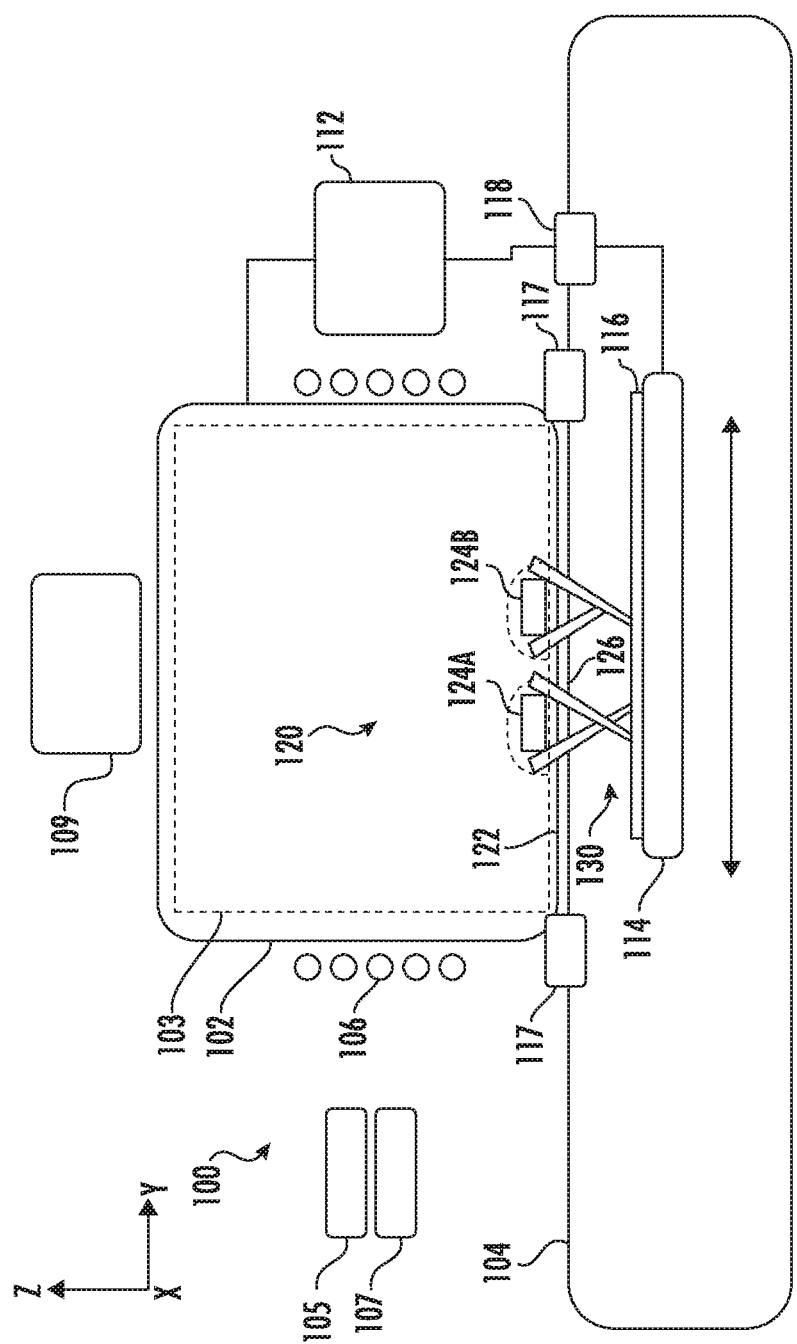
FIG. 1 shows a block diagram of a processing apparatus in accordance with various embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, apparatuses, and systems including extraction optics having movable blockers are disclosed herein with reference to the accompanying drawings, where embodiments are shown. The embodiments may be embodied in many different forms and are not to be construed as being limited to those set forth herein. Instead, these embodiments are provided so the disclosure will be thorough and complete, and will fully convey the scope of methods, systems, and devices to those skilled in the art.

FIG. 1 depicts a system or processing apparatus 100, in accordance with embodiments of this disclosure. The processing apparatus 100 includes a plasma source comprised of a plasma chamber 102 to generate a plasma 103 therein. The plasma chamber 102 may function as part of a plasma source such as an RF inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. In this particular embodiment, the plasma source is an ICP source where the power from an RF generator 105 is coupled into the plasma through an RF matching network 107. The transfer of the RF power from the RF generator to the gas atoms and/or molecules takes places through an antenna 106 and a dielectric window (not shown).

As further shown, a gas manifold 109 may be connected to the plasma chamber 102 through appropriate gas lines and gas inlets. The plasma chamber 102 or other components of the processing apparatus 100 also may be connected to a vacuum system (not shown), such as a turbo molecular pump backed by a rotary or membrane pump. The plasma chamber 102 is defined by chamber walls, and may be arranged adjacent to a process chamber 104, electrically insulated by insulators 117. The process chamber 104 may include a substrate holder 114 and the wafer or substrate 116.

In some embodiments, the plasma chamber 102 may be biased with respect to the substrate holder 114 and the process chamber 104 using a bias voltage supply 112. For example, the plasma chamber 102 may be held at elevated voltage, such as +1000 V, while the substrate holder 114, substrate 116, and process chamber 104 are grounded. Alternatively, the substrate holder 114 may be held at negative potential, while the plasma chamber 102 is grounded. Electrical connection between the bias voltage supply 112 and the substrate holder 114 is accomplished through an electrical feedthrough 118. In these scenarios, positive ions may be extracted from the plasma 103 and directed to the substrate 116 at an ion energy proportionate to the difference in voltage between the plasma chamber 102 and the substrate holder 114.

As further shown, an ion extraction optics (hereinafter "optics") 120 may be arranged along a side of plasma chamber 102. Although non-limiting, the optics 120 may be arranged at the bottom of the plasma chamber 102, extending in a horizontal plane. In some embodiments, the plasma chamber 102 may be arranged to the side of the process chamber 104, where the optics 120 is arranged along a vertical side of the plasma chamber 102. The optics 120 in particular is disposed between the plasma chamber 102 and the process chamber 104. The optics 120 may define a portion of a chamber wall of the plasma chamber 102 or process chamber 104, or both. The optics 120 includes an aperture through which ions may be extracted as ion beams, or ion beamlets 130, and directed toward the substrate 116. Although non-limiting, the optics 120 may include two inner slits and two outer slits allowing beamlets to impact the substrate 116.

In various embodiments, the substrate holder 114 may be coupled to a drive (not shown) configured to move the substrate holder 114 along a direction parallel to the Y axis of the Cartesian coordinate system shown. In further embodiments, the substrate holder 114 may be movable along a direction parallel to the X-axis, Z-axis, or both. This movement provides the processing apparatus 100 with two degrees of freedom, i.e., allows relative position of the substrate versus an extraction aperture to be modified and allows the substrate 116 to be scanned with respect to an aperture so ions may be provided over the entire surface of substrate 116 in some instances. In various embodiments, the substrate holder 114 may be rotatable around the Z-axis in small increments, such as increments of 1 degree, so process uniformity can be improved even more.

In various additional embodiments, and as detailed below, the optics 120 may include separate portions defining a plurality of ion beamlets. In various embodiments, the optics 120 define a plurality of extraction slits, elongated along the X direction (into the plane of figure in FIG. 1). These extraction slits define a plurality of ribbon beams, elongated along the X-direction and having designed properties, such as ion energy, ion current density, designed angle of incidence with respect to the Z-axis, and designed angular spread.

As further illustrated in FIG. 1, the optics 120 may include an extraction plate 122 including a central rib plate 126. In particular embodiments, the optics 120 may further include a first beam blocker 124A and a second beam blocker 124B, arranged proximate to apertures defined by the extraction plate 122, explained in greater detail below. According to various embodiments, in the configuration of FIG. 1, the extraction plate 122, central rib plate 126, first beam blocker 124A, and second beam blocker 124B may define four extraction slits. These four extraction slits may generate four different ribbon beams or ion beamlets 130. By selective arrangement of the extraction plate 122, the first beam blocker 124A, and the second beam blocker 124B, mitigation of the difference in ion angular distributions of the ion beamlets 130 extracted from the different extraction slits is possible, particularly in the case of low power operation, while maintaining 2× increased of total extracted ion beam current with respect to two slits extraction optics configuration.

Figure 2A:
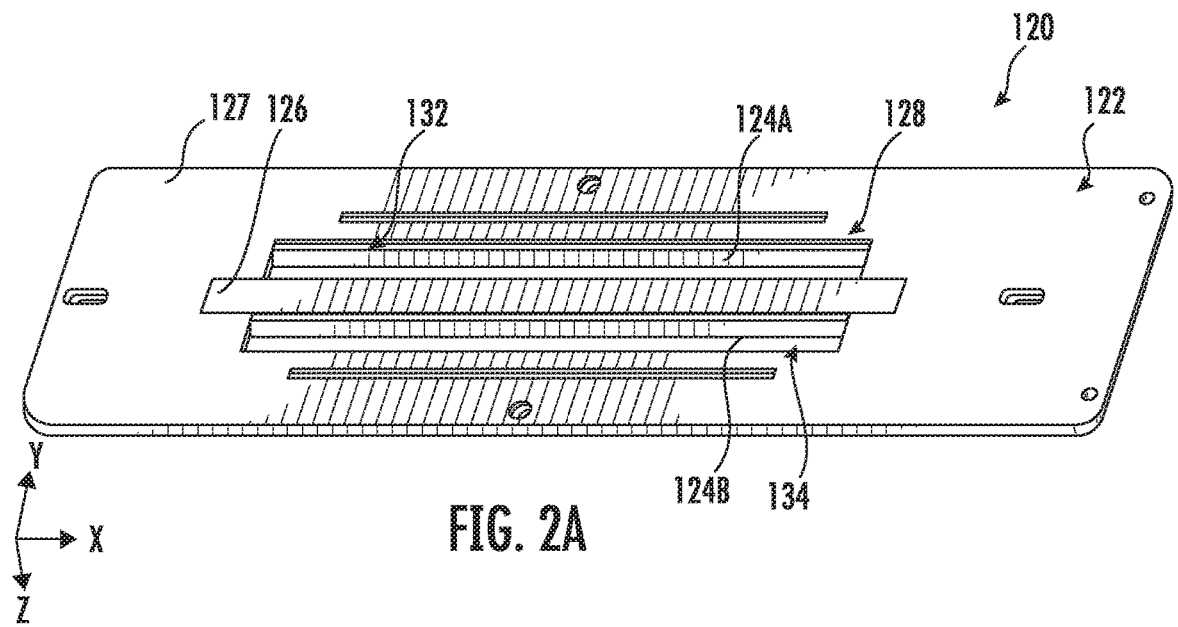
FIG. 2A is a perspective front view of an extraction optics of the processing apparatus of FIG. 1 according to various embodiments of the present disclosure.
Figure 2B:
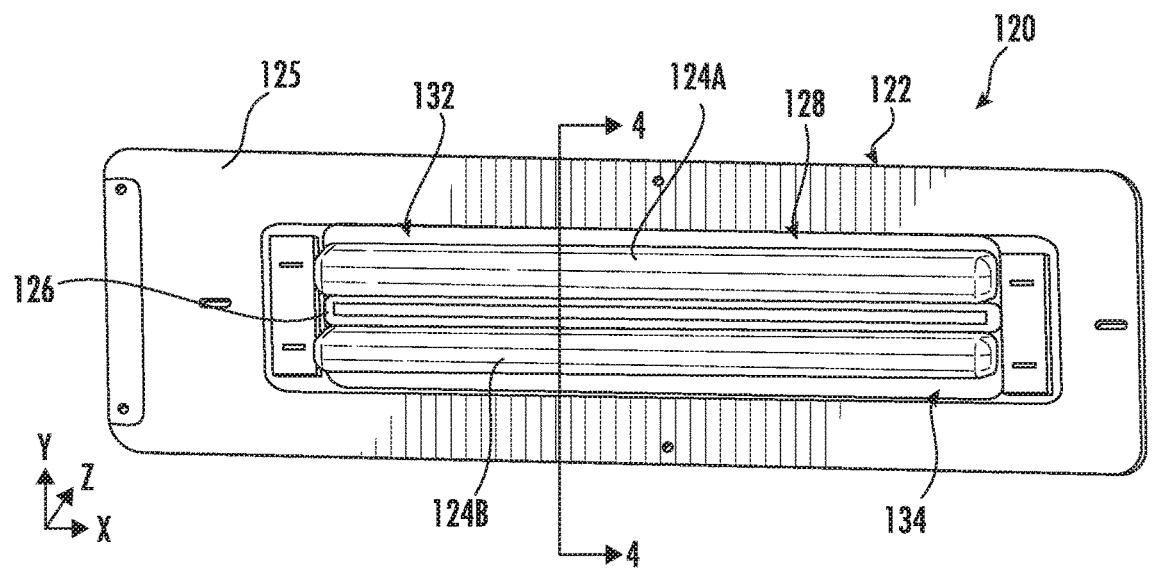
FIG. 2B is a perspective rear view of the extraction optics of the processing apparatus of FIG. 1 according to various embodiments of the present disclosure.

Turning now to FIGS. 2A-2B, there is shown a plan view of the optics 120 according to embodiments of the disclosure. The view of FIG. 2A is shown from the perspective of the process chamber 104, looking towards the plasma chamber 102, while the view of FIG. 2B is shown from the perspective of the plasma chamber, looking towards the process chamber 104. The extraction plate 122 includes a first main side 125 opposite a second main side 127, wherein the first main side 125 faces the plasma chamber and the second main side 127 faces the process chamber 104. As shown, the extraction plate 122 may be a generally rectangular component. Embodiments herein are not limited in this context, however.

The extraction plate 122 may include a cut-out region 128, where the cut-out region 128 is elongated along a first direction, in this case, along the X-axis. The cut-out region 128 may be elongated to the extent to generate an ion beam having a length approximately the same as the length of the cut-out region 128, such as 100 mm, 200 mm, 300 mm, or 400 mm. The embodiments herein are not limited in this context. The cut-out region 128 may further be arranged to have a width along a second direction, perpendicular to the first direction, such as along the Y-axis, as shown. The width of the cut-out region 128 along the Y-axis may be designed to generate a footprint sized to overlap a region of uniform plasma in the plasma chamber 102. Said differently, the cut-out region 128 may be located in the middle of a side of the plasma chamber 102, where the width of the cut-out region 128 along the Y-axis is less than or equal to the width of a region where the plasma is uniform along the Y-axis. In this manner, a plurality of ion beams may be extracted from the cut-out region 128 where the ion current density and angular characteristics do not differ among the different ion beams.

As further shown, the central rib plate 126 may be disposed to overlap the cut-out region 128, while also extending beyond the cut-out region 128 along the X-axis. As such, the central rib plate 126 and the cut-out region 128 define a first aperture 132 and a second aperture 134. In some embodiments, the central rib plate 126 may be positioned to generate the first aperture 132 and the second aperture 134 to have equal size to one another.

In various embodiments, the extraction plate 122 and the central rib plate 126 may be made of electrically conductive material, such as a metal, graphite, or other conductor. According to various embodiments where the extraction plate 122 is made from a first material, the central rib plate 126 may be made of the first material, or of a second material, different from the first material.

As further shown, the first and second beam blockers 124A-124B extend across the cut-out region 128, on opposite sides of the central rib plate 126. Although non-limiting, the first and second beam blockers 124A-124B may extend beyond a plane defined by the second main side 127 of the extraction plate 122.

Turning now to FIG. 3, the optics 120 will be described in greater detail. The first beam blocker 124A is disposed to overlap a portion of the first aperture 132, wherein the first beam blocker 124A and the first aperture 132 through the extraction plate 122 define a first inner slit 142A and a first outer slit 142B. Likewise, the second beam blocker 124B is disposed to overlap a portion of the second aperture 134, wherein the second beam blocker 124B and the second aperture 134 through the extraction plate 122 define a second inner slit 144A and a second outer slit 144B. In some examples, an individual width of the extraction slits (142A-142B and 144A-144B) may be on the order of a few millimeters, one millimeter, or less than one millimeter, while a length of the extraction slits may be on the order of tens of centimeters. Thus, the extraction slits 142A-142B and 144A-144B may define elongated apertures where very narrow ribbon beams may be extracted from the plasma chamber 102.

In some embodiments, the first beam blocker 124A and second beam blocker 124B may be attached to the extraction plate 122 using a mounting structure 123, which accommodates thermal expansion of the first beam blocker 124A and second beam blocker 124B during operation. The concave, U-shape of the first beam blocker 124A and second beam blocker 124B shape the electrostatic potential field lines and facilitate control of angle of incidence and angular spread of ion beams extracted through the optics 120 in embodiments where the first beam blocker 124A and second beam blocker 124B are independently biasable with respect to the extraction plate 122. While the first beam blocker 124A and second beam blocker 124B may be electrical conductors, in some embodiments the first beam blocker 124A and second beam blocker 124B may be electrical insulators. Furthermore, the shape of the first and second beam blockers 124A-124B may vary as well, e.g., from concave having different concavity radii to rectangular (e.g., parallel plate).

In exemplary embodiments, the first beam blocker 124A is rotatable about a first axis 148, the first axis 148 extending parallel to a plane defined by the first main side 125 of the extraction plate 122. Additionally, the first beam blocker 124 may be moveable relative to the extraction plate 122 in a first direction 150 (e.g., along the Z-axis), the first direction 150 perpendicular to the first main side 125 of the extraction plate 122. Similarly, the second beam blocker 124B may be rotatable about a second axis 152, the second axis 152 extending parallel to the first axis 150. As shown, the second beam blocker 124B is also moveable relative to the extraction plate 122 in a first direction 156, which is perpendicular to the first main side 125 of the extraction plate 122.

As further shown, the first inner slit 142A may be defined by a first distance 'D1' between a first blocker first edge 161 and the extraction plate 122. More specifically, the first distance D1 may be measured between the first blocker first edge 161 and a first perimeter point 162 of the first aperture 132, the first perimeter point 162 defined by a first side of the central rib plate 126. The first outer slit 142B may be defined by a distance 'D2' between a first blocker second edge 163 and a second perimeter point 164 of the first aperture 132.

The second inner slit 144A may be defined by a third distance 'D3' between a second blocker first edge 165 and the extraction plate 122. More specifically, the third distance D3 may be measured between the second blocker first edge 165 and a first perimeter point 166 of the second aperture 134, the first perimeter point 166 defined by a second side of the central rib plate 126. The second outer slit 144B may be defined by a distance 'D4' between a second blocker second edge 167 and a second perimeter point 168 of the second aperture 134. In some embodiments, D1 is equal to, or approximately equal to, D3, and D2 is equal to, or approximately equal to, D4.

During operation, plasma density is highest in the plasma chamber 102 proximate the antenna 106 (FIG. 1), where the power deposition occurs. Due to the inherent diffusion processes, the plasma density decreases toward the walls of the plasma chamber 102. As a consequence, the plasma density profile in vertical direction (e.g., along the y-axis) has a parabolic-like shape. Therefore, first and second inner slits 142A, 144A will see a higher plasma density than first and second outer slits 142B, 144B. To mitigate this discrepancy, the first and second beam blockers 124A-124B are rotatable about the first axis 148 and the second axis 152, respectively, to adjust any of distances D1-D4. Additionally, the first and second beam blockers 124A-124B are moveable relative to the extraction plate 122 to further adjust any of distances D1-D4. In some embodiments, the first beam blocker 124A may be rotated in a clockwise direction, towards the central rib plate 126, and the second beam blocker 124B may be rotated in a counterclockwise direction. This increases the size of the first outer slit 142B relative to the first inner slit 142A, and the size of the second outer slit 144B relative to the second inner slit 144A. In the non-limiting embodiment shown, the first beam blocker 124A is rotated by as first angle '−α' and the second beam blocker 124B is rotated by a second angle '−α'. An absolute value of the first and second angles may be the same or different.

Figure 4A:
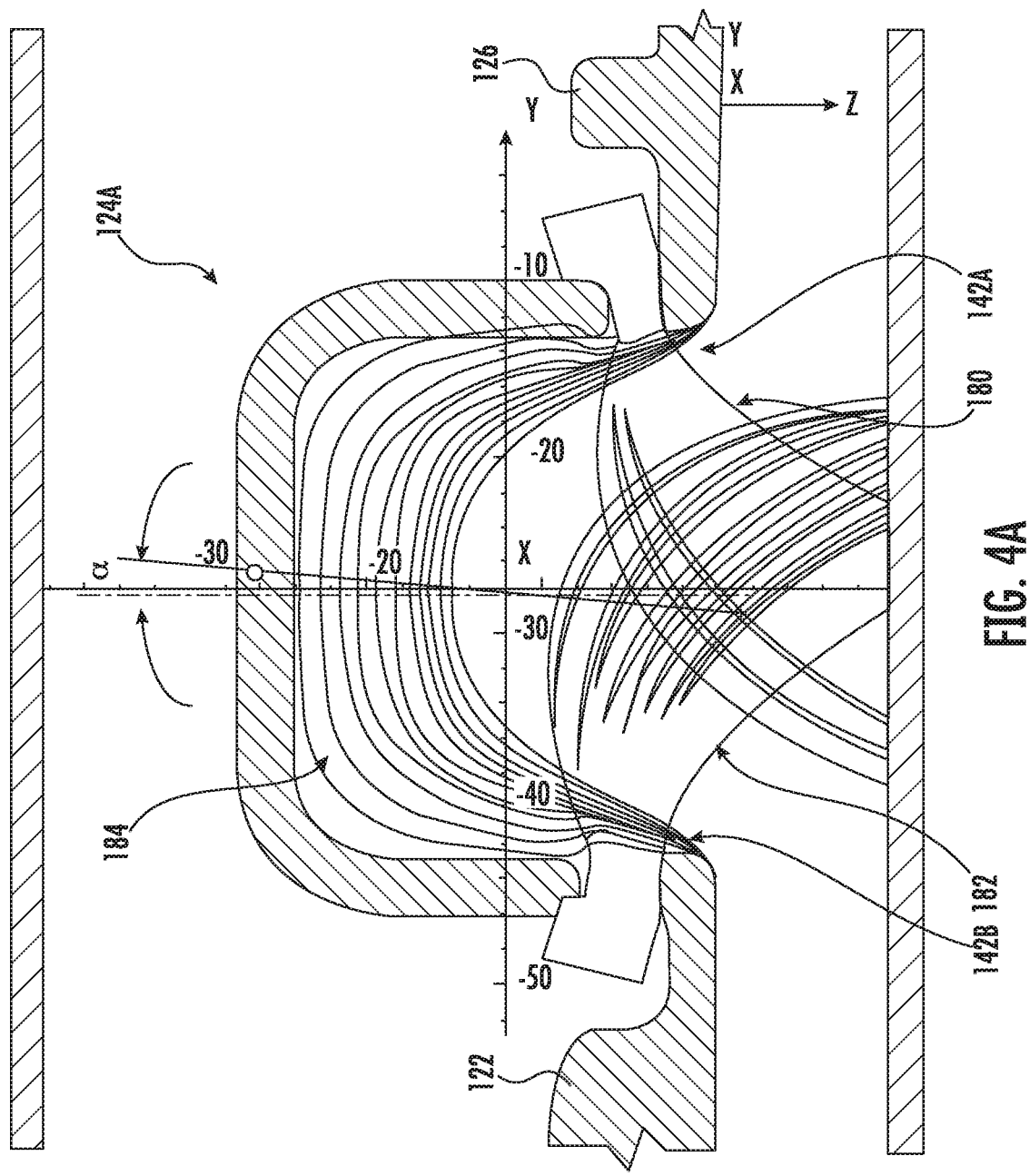
FIGS. 4A-4B are graphs demonstrating effects of rotating beam blockers according to various embodiments of the present disclosure.
Figure 4B:
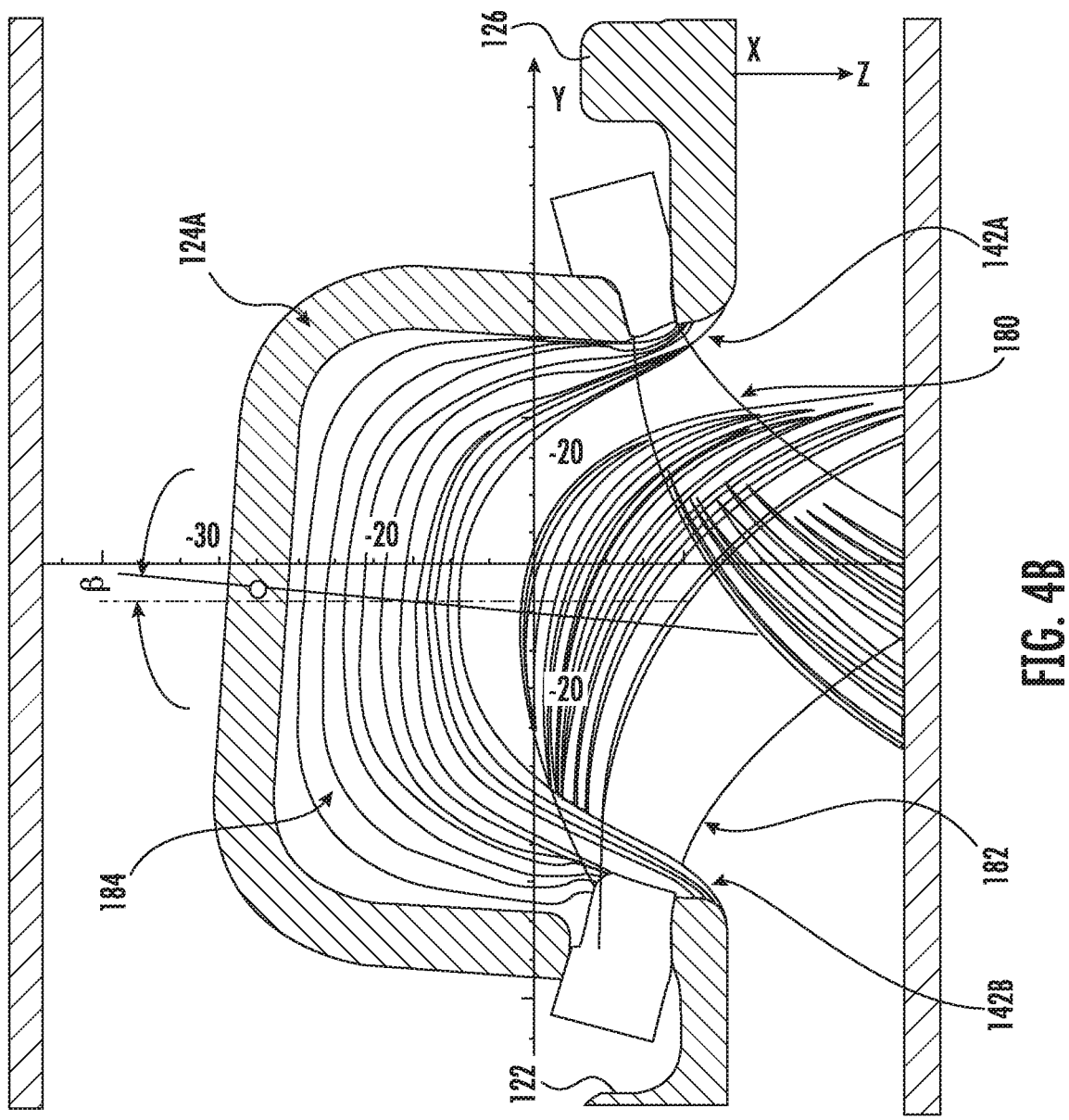

FIGS. 4A-4B demonstrate principles of the disclosure in greater detail.

Although only the first beam blocker 124A is shown, it'll be appreciated that the described approaches similarly apply to the second beam blocker 124B. FIG. 4A demonstrates the first beam blocker 124A rotated by an angle 'α' of approximately 2.5 degrees about the first axis 148, while FIG. 4B demonstrates the first beam blocker 124A rotated by an angle 'β' of approximately 5 degrees about the first axis 148.

As stated above, addressing the difference in the ion angular distributions of an inner beamlet 180 and an outer beamlet 182 may be overcome by rotating the first beam blocker 124A to shift an equipotential line distribution 184 toward the first inner slit 142A and farther from the first outer slit 142B. The rotation of the first beam blocker 124A leads to the narrowing of the first inner slit 142A and widening of the first outer slit 142B. Narrowing and respectively widening the first inner slit 142A and the first outer slit 142B, will compensate for the difference in the extracted ion beam currents. Inner slits will have smaller cross-sectional areas whereas outer slits will have a bigger cross-sectional area. In some embodiments the product between plasma density and extraction slit area should be constant, i.e., $$n_m^{outer} * A_{slit}^{outer} = n_m^{inner} * A_{slit}^{inner}.$$

Balancing the extracted ion beam currents through the inner and outer slits may provide identical space charge effects on ion angular distributions. Although not shown, it will be appreciated that a third beamlet is similarly received at the wafer 116 through the second inner slit 144A of the second beam blocker 124B, and a fourth beamlet is received at the wafer 116 through the second outer slit 144B of the second beam blocker 124B.

Figure 5A:
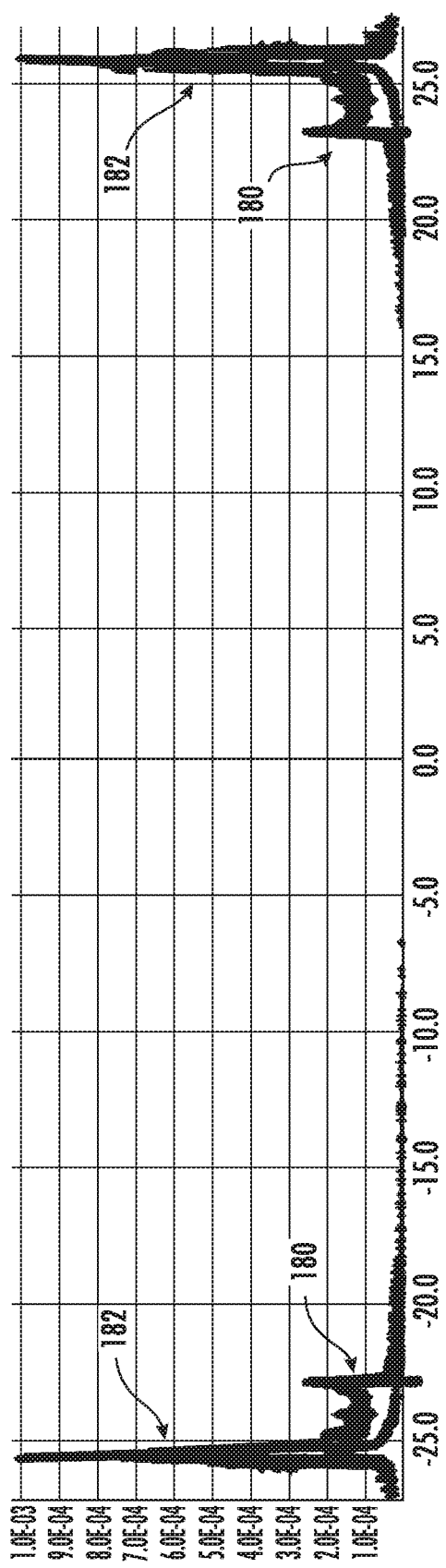
FIGS. 5A-5B are graphs demonstrating ion angular distributions of inner and outer beamlets according to various embodiments of the present disclosure.
Figure 5B:
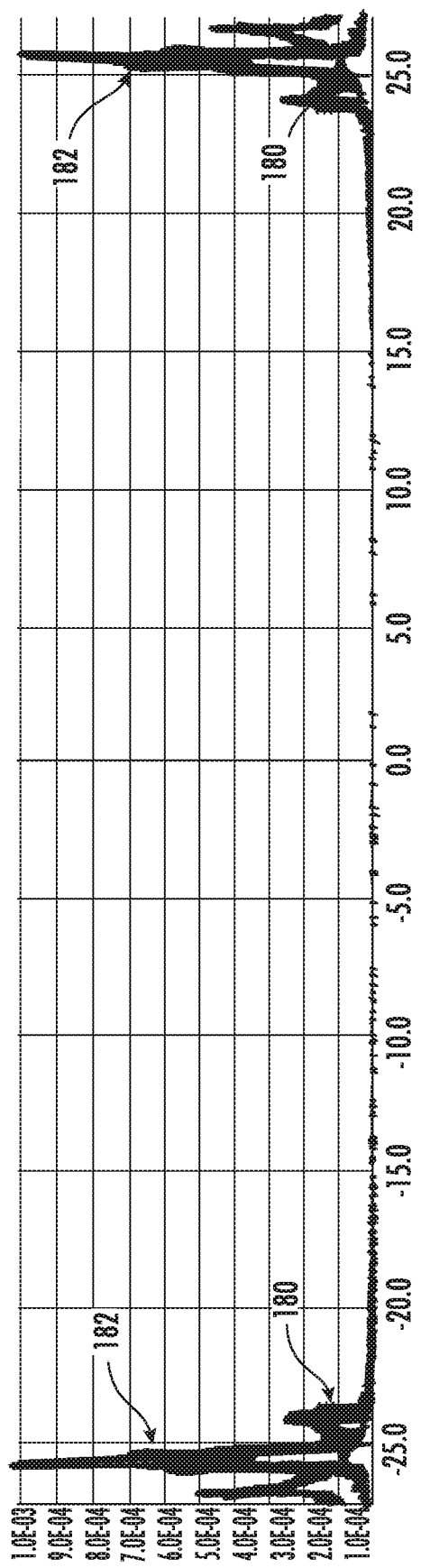

The overall effect of the blockers' rotation and/or movement away from the extraction plate 122 will be quasi-similar ion angular distributions of the inner and outer beamlets for both the first beam blocker 124A and the second beam blocker 124B. For example, as can be seen in FIG. 5A, the IADs corresponding to the first and second beam blockers 124A-124B rotated by 2.5 deg show a mean angle of 25 deg and an angular spread of 4 deg for the inner beamlets 180, whereas the outer beamlets 182 have an angular spread of 26.5 deg and an angular spread of 0.5 deg. As shown in FIG. 5B, when the first and second beam blockers 124A-124B are rotated by 5 degrees, the IAD characteristics of the inner beamlets 180 show 26 deg mean angle and 3 deg angular spread whereas the outer beamlets 182 mean angle is 26 deg and the angular spread is 0.5 deg. As demonstrated, the IADs of the inner and outer beamlets 180, 182 are similar in terms of mean angle and quasi similar in angular spread.

Figure 6A:
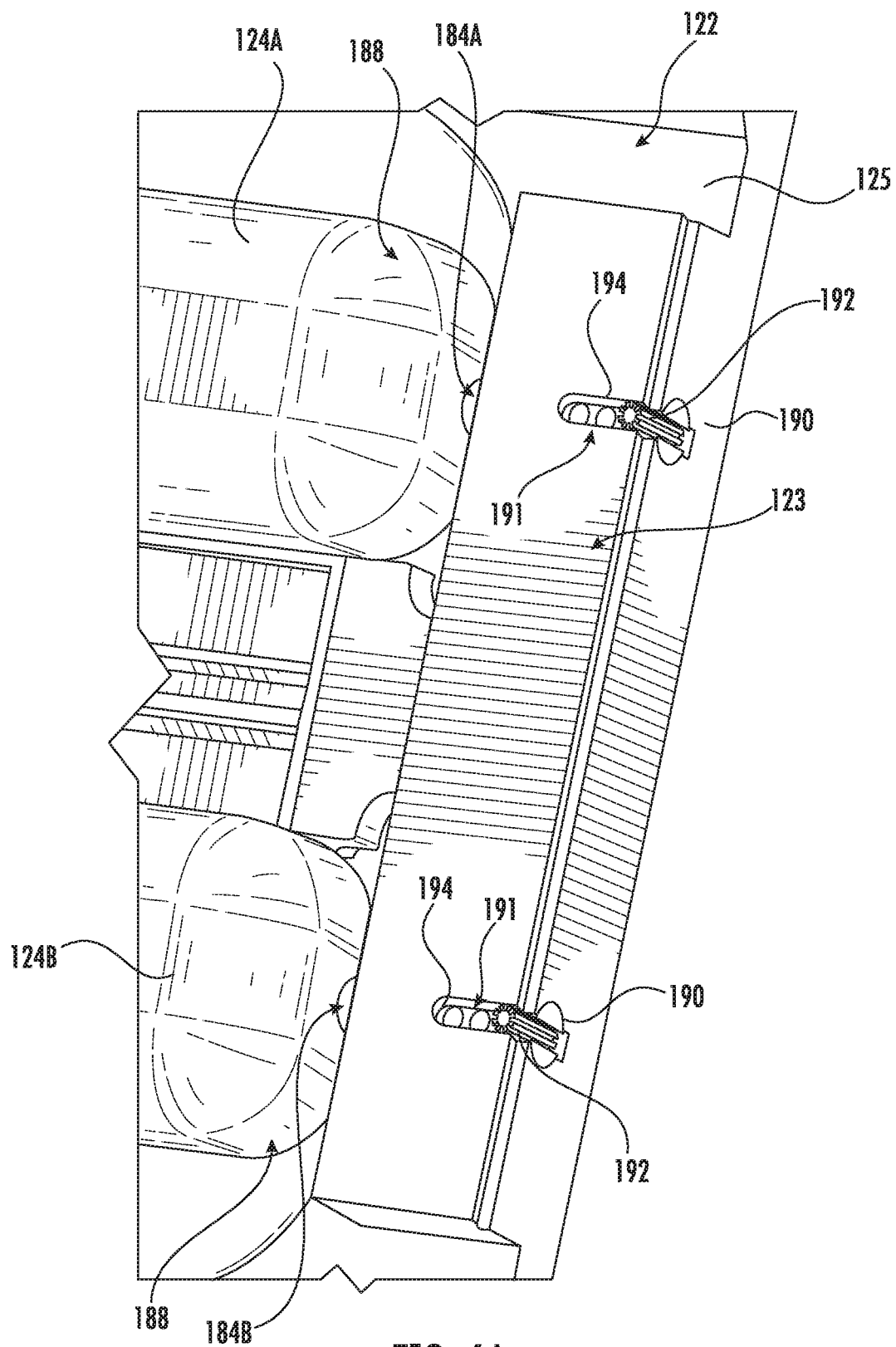

Turning now to FIGS. 6A-6B, an apparatus for rotating the first and second beam blockers 124A-124B according to embodiments of the present disclosure will be described. As shown, the first and second beam blockers 124A-124B may be coupled to the extraction plate 122 using a set of supports 184A-184B rotatable and/or movable within the mounting structure 123, which extends from the first main side 125. As shown, the supports 184A-184B may extend from a first end 188 of respective first and second beam blockers 124A-124B. Although not shown, it'll be appreciated that similar supports may be present at an opposite end of the first and second beam blockers 124A-124B.

In some embodiments, each support 184A-184B may include a cylindrical shaft 190 having a plurality of openings 191 formed therein. A pin 192 is operable to engage one of the openings 191 to prevent rotation of the cylindrical shaft 190 once a desired angular position of the first and second beam blockers 124A-124B is achieved. As shown, the pin 192 is configured to engage a sidewall of a recess 194 formed in an upper surface 195 of the mounting structure 123. To adjust an angular rotation of the first and/or second beam blockers 124A-124B, the pin 192 may be removed. As best shown in FIG. 6B, the openings 191 may be located at different angular positions about the cylindrical shaft 190. The axes of these openings 191 are perpendicular to a central axis of the cylindrical shaft 190 and rotated in predefined angular increments. The first and second blockers 124A-124B are rotated until the opening 191 corresponding to the desired angle is aligned with the recess 194.

FIG. 5 is a flowchart depicting a method 200 according to embodiments of the present disclosure. At block 201, the method 200 may include providing an ion extraction optics arranged along a side of a plasma chamber, the ion extraction optics including an extraction plate including a first opening and a second opening, and a first blocker extending over the first opening and a second blocker extending over the second opening, each of the first and second blockers including an inner slit defined by a first distance between an inner edge and the extraction plate, and an outer slit defined by a second distance between an outer edge and the extraction plate.

In some embodiments, the method may include rotating the first blocker about a first axis of rotation, the first axis of rotation extending parallel to a plane defined by a first main side of the extraction plate, and rotating the second blocker about a second axis of rotation, the second axis of rotation extending parallel to the first axis of rotation. In some embodiments, moving the first and second blockers may further include moving the first blocker along a first axis, the first axis perpendicular to the plane defined by the first main side of the extraction plate.

In some embodiments, the method may include maintaining the chamber at a ground potential, wherein the wafer is biased by a negative voltage. In some embodiments, the method may include generating a plasma within the plasma chamber.

At block 203, the method may include varying at least one of the first distance and the second distance by moving the first and second blockers. At block 205, the method 200 may optionally include delivering an ion beamlet to a wafer through each of the inner and outer slits.

As used herein, the term "angle of incidence" may refer to the mean angle of incidence of a group of ions of an ion beam with respect to the normal on the substrate surface. The term "angular spread" may refer to the width of distribution or range of angles of incidence centered around a mean angle, termed for short. In the embodiments disclosed herein the novel extraction system may increase ion current extracted from a plasma in a ribbon beam configuration, while not affecting ion beam other parameters such as angle of incidence or angular spread.

While the aforementioned embodiments focus on four-slit configurations, in additional embodiments, six-slit configurations and eight-slit configurations are possible. For example, a six-slit configuration may be realized wherein two central rib plates are positioned over a common cut-out region, to define three extraction apertures. Thus, three respective beam blockers may be positioned to overlap the three respective extraction apertures, where a given beam blocker may define a pair of extraction slits with the extraction aperture. Likewise, an eight-slit configuration may be realized by positioning three central rib plates over a common cut-out region, to define four extraction apertures, which apertures are paired with four beam blockers. Generally, a multi-slit ion extraction optics according to the present embodiments may be constructed using one cut-out region, N central rib plates, and N+1 beam blockers, where the number of extraction slits is equal to 2(N+1).

For the sake of convenience and clarity, terms such as "top," "bottom," "upper," "lower," "vertical," "horizontal," "lateral," and "longitudinal" are used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An ion extraction system, comprising:
a plasma chamber operable to generate a plasma;
an ion extraction optics arranged along a side of the plasma chamber, the ion extraction optics comprising:
an extraction plate including a first opening; and
a first beam blocker extending over the first opening, the first beam blocker comprising:
a first inner slit defined by a first distance between a first beam blocker first edge and the extraction plate; and
a first outer slit defined by a second distance between a first beam blocker second edge and the extraction plate, wherein the first beam blocker is movable to vary at least one of the first distance and the second distance.

2. The ion extraction system of claim 1, wherein the first beam blocker is rotatable about a first axis, the first axis extending parallel to a plane defined by a first main side of the extraction plate, and wherein the first beam blocker is moveable relative to the extraction plate in a first direction, the first direction perpendicular to the plane.

3. The ion extraction system of claim 2, further comprising a second beam blocker extending over a second opening through the extraction plate, the second beam blocker comprising:
a second inner slit defined by a third distance between a second beam blocker first edge and the extraction plate; and
a second outer slit defined by a fourth distance between a second beam blocker second edge and the extraction plate, wherein the second beam blocker is movable to vary at least one of the third distance and the fourth distance.

4. The ion extraction system of claim 3, wherein the second beam blocker is rotatable about a second axis, the second axis extending parallel to the first axis, and wherein the second beam blocker is moveable relative to the extraction plate in the first direction.

5. The ion extraction system of claim 3, wherein the first distance is equal to the third distance, and wherein the second distance is equal to the fourth distance.

6. The ion extraction system of claim 3, further comprising a wafer receiving a first beamlet through the first inner slit, a second beamlet through the first outer slit, a third beamlet through the second inner slit, and a fourth beamlet through the second outer slit.

7. The ion extraction system of claim 6, wherein the plasma chamber is at a ground potential and the wafer is biased by a negative voltage.

8. The ion extraction system of claim 1, wherein the first beam blocker includes a support rotatable within an opening of the extraction plate.

9. An ion extraction optics, comprising:
an extraction plate including a first opening and a second opening;
a first beam blocker extending over the first opening and a second beam blocker extending over the second opening, each of the first and second beam blockers comprising:
an inner slit defined by a first distance between an inner edge and the extraction plate; and
an outer slit defined by a second distance between an outer edge and the extraction plate, wherein the first and second beam blockers are movable to vary at least one of the first distance and the second distance.

10. The ion extraction optics of claim 9, wherein the first beam blocker is rotatable about a first axis and the second beam blocker is rotatable about a second axis, the second axis extending parallel to the first axis, and wherein the first and second beam blockers are moveable relative to the extraction plate in a first direction, the first direction extending perpendicular to a plane defined by a first main side of the extraction plate.

11. The ion extraction optics of claim 9, each of the first and second beam blockers having a U-shaped profile.

12. The ion extraction optics of claim 9, wherein the first and second beam blockers include a support rotatable within an opening of the extraction plate.

13. The ion extraction optics of claim 12, the support comprising:
a cylindrical shaft; and
a plurality of openings through the cylindrical shaft, wherein a pin is operable to engage an opening of the plurality of openings to prevent rotation of the cylindrical shaft.

14. A method, comprising:
providing an ion extraction optics arranged along a side of a plasma chamber, the ion extraction optics comprising:

an extraction plate including a first opening and a second opening;

a first beam blocker extending over the first opening and a second beam blocker extending over the second opening, each of the first and second beam blockers comprising:

an inner slit defined by a first distance between an inner edge and the extraction plate; and an outer slit defined by a second distance between an outer edge and the extraction plate; and varying at least one of the first distance and the second distance by moving the first and second beam blockers.

15. The method of claim 14, wherein moving the first and second beam blockers comprises:

rotating the first beam blocker about a first axis of rotation, the first axis of rotation extending parallel to a plane defined by a first main side of the extraction plate; and rotating the second beam blocker about a second axis of rotation, the second axis of rotation extending parallel to the first axis of rotation.

16. The method of claim 15, wherein moving the first and second beam blockers further comprises moving the first beam blocker along a first axis, the first axis perpendicular to the plane defined by the first main side of the extraction plate.

17. The method of claim 14, further comprising delivering an ion beamlet to a wafer through each of the inner and outer slits.

18. The method of claim 17, wherein the plasma chamber is maintained at a ground potential, and wherein the wafer is biased by a negative voltage.

19. The method of claim 14, further comprising generating a plasma within the plasma chamber.

* * * * *